Nov. 20, 1962 M. RIBNER 3,065,363
PULSE CODE GENERATOR EMPLOYING SATURABLE REACTORS HAVING DIFFERENT SATURATING TIMES TO RESPECTIVE DELAY
Filed Feb. 19, 1960
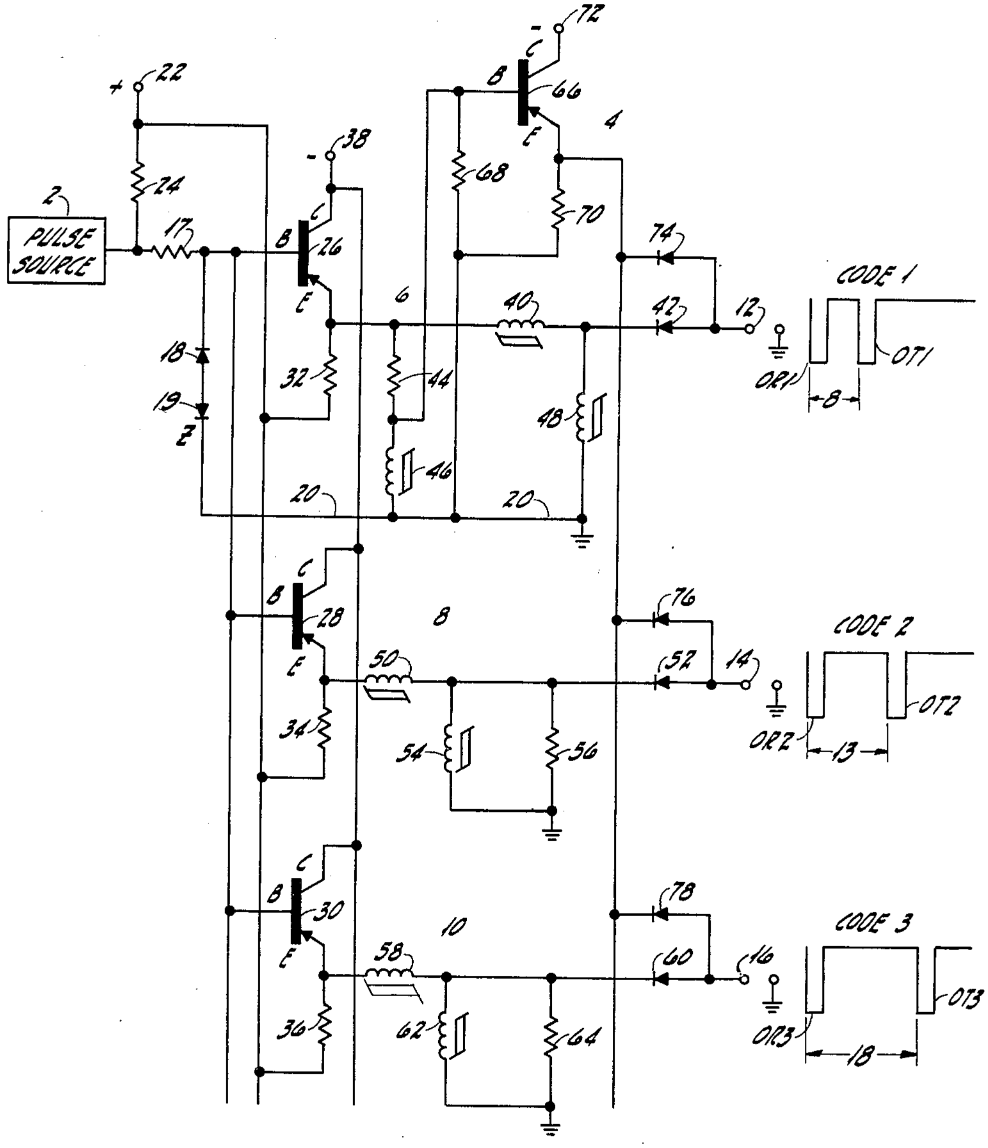
INVENTOR.
MORRIS RIBNER
BY Wm. A. Autio
ATTORNEY

United States Patent Office 3,065,363

Patented Nov. 20, 1962

3,065,363

PULSE CODE GENERATOR EMPLOYING SATURABLE REACTORS HAVING DIFFERENT SATURATING TIMES TO RESPECTIVE DELAY

Morris Ribner, Chicago, Ill., assignor to International Telephone and Telegraph Corporation Filed Feb. 19, 1960, Ser. No. 9,881
18 Claims. (Cl. 307—88.5)

This invention relates to electrical systems and more particularly to pulse generator systems for providing a plurality of time controlled electrical output signals in response to an electrical input signal.

While not limited thereto, the invention is especially applicable to pulse coding of telephone channels and the like.

In the fields of electrical control and switching systems and the like, it is often necessary to identify a plurality of communication paths or channels and to distinguish one from another. One manner of doing this is to provide pairs of electrical pulses, one such pair for each channel, and each pair of pulses having a first reference pulse and a second pulse spaced in time from the reference pulse with the time spacing of the pulses of each pair being different for different channels. Various expedients have heretofore been employed to generate time spaced pulses. Use of a series of monostable multivibrators comprised of active elements such as vacuum tubes or transistors each of which is triggered at a predetermined time, has the disadvantages of maintenance and the like inherent in the use of large numbers of active elements. Use of passive delay lines for the production of time spaced pulses has limitations in that the durations of the pulses and the time separations between the pulses that may be produced are restricted. Therefore, it is desirable to provide pulse generator circuitry of the magnetic type which overcomes the aforementioned disadvantages, which is capable of providing pulse lengths that are longer in duration and pulses having longer time separations therebetween, which is capable of producing square shaped pulses without the use of additional shaping networks and which employs a minimum number of active elements.

An object of the invention is to provide new and improved coding circuitry.

Another object of the invention is to provide improved pulse generator circuitry of the magnetic type.

A more specific object of the invention is to provide improved means employing magnetic delay elements for providing a plurality of time spaced electrical output signals in response to an electrical input signal.

Another object of the invention is to provide improved means for providing a plurality of coded pulse time signals in response to an input pulse.

Another object of the invention is to provide improved means for providing time coded pulse signals having comparatively long time intervals between the pulses.

In accordance with the invention, an electrical pulse generator system is provided with a single input and a plurality of ouputs for providing a corresponding plurality of coded output signals, each such output signal having a reference pulse and a time spaced pulse with the time spacing being different for each of the different outputs. A single transistor is employed to provide the reference pulse for all outputs. A plurality of transistors is provided, one for each output of which one als feeds the reference pulse transistor, for switching simultaneously responsive to an input pulse. A plurality of delay inductor devices is provided, one for each output and each having a series and a shunt inductor, which respond to the switching transistors for providing variously delayed output pulses; the time spacing between each reference pulse and its associated delayed pulse being determined by the characteristics of the associated inductor device.

The aforementioned and other objects and advantages of the invention, together with the manner of obtaining them, will become more apparent and the invention itself will be best understood by making reference to the following detailed description of an embodiment of the invention in conjunction with the accompanying drawing wherein:

The FIGURE shows a pulse generator system constructed in accordance with the invention.

Referring to the single FIGURE of the drawing, there is shown an airput negative voltage pulse source 2, a reference pulse circuit 4 and a plurality of pulse control and delay circuits 6, 8 and 10 associated with output terminals 12, 14 and 16, respectively. Pulse source 2 is connected through a current limiting resistor 17, a rectifier such as a standard diode 18 or the like, a voltage regulator such as a Zener diode 19 of the P-N junction type or the like and a common conductor 20 to ground potential. A source of positive voltage 22 is connected through a resistor 24 to input pulse source 2. The junction of diode 18 and resistor 17 is connected directly and in parallel to base electrodes B of a plurality of controllable switching semi-conductor devices such as transistors 26, 28 and 30 of the P-N-P conductivity type or the like. Source 22 is also connected through a resistor 32 to emitter electrode E of transistor 26, through a resistor 34 to emitter electrode E of transistor 28 and through a resistor 36 to emitter electrode E of transistor 30. Collector electrodes C of transistors 26, 28 and 30 are connected directly to a source 38 of negative voltage. The junction of emitter E of transistor 26 and resistor 32 is connected through a delay device such as a series inductor 40 and a unidirectional conducting device such as a diode 42 or the like to output terminal 12, diode 42 being poled to conduct in the direction from output terminal 12 toward inductor 40 and to block current flow in the opposite direction. The junction of emitter E of transistor 26 and resistor 32 is also connected through a resistor 44 and a delay device such as a shunt inductor 46 and conductor 20 to ground potential. The junction of inductor 40 and diode 42 is connected through a delay device such as a shunt inductor 48 to ground potential.

Pulse delay circuit 8 is similarly provided with a delay device such as a series inductor 50, the junction between emitter E of transistor 28 and resistor 34 being connected through such inductor and a unidirectional conducting device such as a diode 52 to output terminal 14, diode 52 being similarly poled to conduct in the left-hand direction and to block current flow in the right-hand direction. The junction between inductor 50 and diode 52 is connected through a delay device such as a shunt inductor 54 in parallel with a trimmer resistor 56 to ground potential.

Pulse delay circuit 10 is similarly provided with a delay device such as a series inductor 58, the junction between emitter E of transistor 30 and resistor 36 being connected through such inductor and a unidirectional conducting device such as a diode 60 to output terminal 16, diode 60 being poled to conduct in the left-hand direction and to block current flow in the right-hand direction. The junction between inductor 58 and diode 60 is connected through a delay device such as a shunt inductor 62 in parallel with a trimmer resistor 64 to ground potential.

Reference pulse circuit 4 is provided with a controllable semi-conductor device such as a transistor 66 of the P-N-P conductivity type or the like having an emitter electrode E, a collector electrode C and a base electrode B. Base B is connected through a resistor 68 and conductor 20 to ground potential and emitter E is connected through a resistor 70 and conductor 20 to ground potential and emitter E is connected through a resistor 70 and conductor 20 to ground potential to normally maintain transistor 66 non-conducting. Collector C is connected directly to the source 38 of negative voltage. Output terminals 12, 14 and 16 are connected through uni-directional conducting devices such as diodes 74, 76 and 78 respectively, to emitter E of transistor 66. It may be assumed tnat output terminals 12, 14 and 16 are connected through suitable load devices to ground potential.

While the system has been illustrated as having three output terminals 12, 14 and 16, it will be apparent that additional outputs can be provided by connecting additional pulse control and delay circuits similar to circuit 10 to the conductors extending downwardly at the lower portion of the figure.

The operation of the system will now be described.

Normally positive voltage is applied from source 22 through resistors 32, 34 and 36 to emitters E of transistors 26, 28 and 30, respectively. Positive voltage is also applied from source 22 through resistors 24 and 17 to bases B of transistors 26, 28 and 30 to maintain the latter non-conducting. Ground potential is applied through conductor 20 and then in parallel through resistors 68 and 70 to base B and emitter E, respectively, of transistor 66 to maintain the latter non-conducting.

Let it be assumed that a repetitive square wave of negative voltage is applied from pulse source 2 to the common input of the system. This causes current flow from positive source 22 through resistor 24 to negative pulse source 2. The voltage drop across resistor 24 causes the voltage at bases B of transistors 26, 28 and 30 to decrease relative to the voltage at emitters E thereof to render the same conducting. The first input square wave pulse also causes diodes 18 and 19 to conduct and causes current flow from ground through conductor 20, diodes 18 and 19 and resistor 17 to source 2. The voltage across diode 19 remains constant at its Zener voltage value during the input pulse thereby to regulate the input voltage to transistors 26, 28 and 30 and consequently to maintain the amplitude of the output voltage pulses constant. Current flows from positive source 22 through resistor 32 and emitter E and collector C of transistor 26 to negative source 38. Similarly current flows from source 22 through resistor 34 and emitter E and collector C of transistor 28 to source 38. Also, current flows from source 22 through resistor 36 and emitter E and collector C of transistor 30 to source 38. Diode 18 is necessary to prevent the positive voltage at source 22 from being grounded through resistors 24 and 17 and Zener diode 19 which acts as a standard diode in its forward direction.

The aforementioned conduction of transistor 26 causes operation of transistor 66 to afford negative output reference pulses OR1, OR2 and OR3 at output terminals 12, 14 and 16, respectively, as graphically shown at the right-hand side of each such output terminal. To this end, current flows from ground through conductor 20, the voltage divider comprising resistors 68 and 44 and emitter E and collector C of transistor 26 to negative source 38. Delay inductor 46 initially permits only an extremely small value of current flow therethrough in order not to shunt resistor 68. Inductor 46 comprises a magnetic core and a coil winding and is a square-hysteresis-loop magnetic core inductor. The induced counter voltage caused by the increase of magnetic flux in the core affords, in effect, an internal impedance of high value and delays the time at which saturation occurs. Due to this high impedance, the current flows initially through resistor 68. The voltage drop across resistor 68 causes the voltage at base B to become negative relative to the voltage at emitter E of transistor 66 to render the latter conducting. Current flows from output terminals 12, 14 and 16 through diodes 74, 76 and 78, respectively, and then through emitter E and collector C of transistor 66 to negative source 72. As a result of this current flow, steep wave front negative reference voltage pulses OR1, OR2 and OR3 are applied to the respective output terminals. When inductor 46 saturates a predetermined time interval after the initiation of the output reference pulse, the current through the inductor increases rapidly to effectively shunt resistor 68. As a result, ground potential is applied through conductor 20 and resistor 68 to base B to render transistor 66 non-conducting. When transistor 66 is rendered non-conducting, ground potential is applied through conductor 20 and resistor 70 and then to diodes 74, 76 and 78 in parallel to abruptly terminate the output reference pulses.

The series inductors 40, 50 and 58 and the shunt inductors 48, 54 and 62 in pulse delay circuits 6, 8 and 10, respectively, function to provide progressively delayed or timed output pulses OT1, OT2 and OT3 at output terminals 12, 14 and 16, respectively. It will be recalled that switching transistors 26, 28 and 30 were concurrently rendered conducting in response to a negative square wave input pulse to cause current flow therethrough in the circuits hereinbefore described. Such conduction of transistor 26 initiates a corresponding square wave pulse of current in a circuit extending from output terminal 12 through diode 42, series inductor 40 and emitter E and collector C of transistor 26 to source 38. This current pulse is acted upon by series inductor 40 which is of the square-hysteresis-loop magnetic core inductor type. The induced counter voltage caused by the increase of magnetic flux in the core affords in effect an internal impedance of high value and delays the time at which saturation occurs. Therefore, only an extremely small value of current may flow in the circuit of output terminal 12 until saturation occurs. When inductor 40 saturates, current flows in the circuit to provide a steep wave front square wave negative output timed voltage pulse OT1 at output terminal 12 as graphically shown adjacent the output terminal and the voltage from source 38 is applied to shunt inductor 48. The time delay between the initiation of reference pulse OR1 and the initiation of delayed pulse OT1 for purposes of description may be assumed to be eight time units and is dependent on the physical structural characteristics of series inductor 40.

Delayed output pulse OT1 is abruptly terminated by shunt inductor 48. Shunt inductor 48 is similar to series inductor 40 except that it requires a predetermined shorter period of time to saturate. It will be apparent that shunt inductor 48 is connected to ground potential in parallel with diode 42 and the load which is connectable to output terminal 12. The shunt inductor functions in a manner similar to that of the series inductor following saturation of the latter. Thus, during the time that is required for shunt inductor 48 to saturate, only an extremely small value of current is shunted from the load to ground. When inductor 48 saturates, its impedance decreases so that its direct current winding resistance constitutes the primary impedance to current flow therethrough to ground. As a result, output terminal 12 is effectively connected through diode 42 and inductor 48 to ground abruptly to terminate delayed pulse OT1.

Pulse delay circuits 8 and 10 function in a manner similar to pulse delay circuit 6 except that series inductors 50 and 58 are constructed to provide progressively greater delay periods between the initiation of reference pulses OR2 and OR3 and the initiation of output timed pulses OT2 and OT3, respectively. Thus, for purposes of description, such delay period between reference pulse OR2 and delayed pulse OT2 at output terminal 14 may be assumed to be equal to thirteen time units. And the delay period between reference pulse OR3 and delayed pulse OT3 at output terminal 16 may be assumed to be equal to 18 time units for exemplary purposes. Also, shunt inductors 54 and 62 as used are identical to shunt inductor 48 thereby to terminate delayed pulses OT2 and OT3 at equal relative times, respectively.

Trimmer resistors 56 and 64 which are connected in parallel with shunt inductors 54 and 62 in pulse delay circuits 8 and 10, respectively, have relatively high resistance values and are provided for the purpose of adjusting the action of the shunt inductors. Thus, connection of a desired value of resistance across the shunt inductor affects an adjustment in the time that is required for the inductor to saturate in accordance with the current flow that is shunted through the resistor. Accordingly, resistors 56 and 64 afford adjustments in the duration of delayed pulses OT2 and OT3. Diodes 42, 52, 60, 74, 76 and 78 function to isolate the output terminals and component circuits from one another.

It will be apparent that the system hereinbefore described provides square wave output reference voltage pulses OR1, OR2 and OR3 in response to each square wave input voltage pulse whose duration must be longer than that of the total time from the initiation of the reference pulse to the termination of the last delayed pulse. Each output reference pulse is provided with a steep wave front as a result of the substantially instantaneous switching action of transistors 26 and 66. The output reference pulses are provided with constant amplitude under the control of voltage regulating diode 19. The output reference pulses are abruptly terminated in response to the rapid decrease in impedance upon saturation of inductor 46. Each square wave output timed pulse OT1, OT2 and OT3 is provided with a steep wave front as a result of the rapid decrease in impedance when the associated series inductor saturates. The output timed pulses are provided with constant amplitude under the control of voltage regulating diode 19. And each output timed pulse is abruptly terminated in response to the rapid decrease in shunt impedance when the associated shunt inductor saturates. The series and shunt inductors have inherent characteristics such that the invention affords pulse lengths of longer duration and longer time spacing between reference and delayed pulses than has been possible with passive delay lines and the like. At the termination of the negative half of the square wave the positive voltage applied to cores 40, 46, 48, 50, 54, 58 and 62 through resistors 32, 44, 34, and 36 reverse the saturation of the square-hysteresis-loop cores to the polarity which permits the generation of the negative reference and delayed pulses when the negative half of the square wave voltage returns.

While the invention hereinbefore described is effectively adapted to fulfill the objects stated, I do not intend to confine my invention to the particular preferred embodiment of pulse generator system disclosed, inasmuch as it is susceptible of various modifications without departing from the scope of the appended claims.

I claim:

1. In an electrical system for providing a plurality of coded output signals in response to an input signal, a source of input signals, a plurality of output terminals, means responsive to an input signal for concurrently providing an identical reference signal at each of said output terminals, and means also responsive to said input signal for providing delayed output signals at the respective output terminals and comprising magnetic means for delaying said output signals by different preselected time intervals for the different output terminals, the reference signal in combination with the delayed output signal at each output terminal constituting a time-spaced output signal code.

2. The invention defined in claim 1, together with a semi-conductor device for regulating the amplitude of the input signal.

3. The invention defined in claim 1, wherein the first mentioned means comprises semi-conductor control means operable in response to said input signal for concurrently initiating said reference signal at each of said output terminals, and magnetic means responsive to operation of said semi-conductor control means for controlling the latter to terminate each said reference signal a predetermined time interval after initiation thereof.

4. The invention defined in claim 1, wherein the first mentioned means comprises first and second semi-conductor control means, means responsive to said input signal for rendering said first semi-conductor control means operative, means responsive to operation of said first semi-conductor control means for rendering said second semi-conductor control means operative, and means responsive to operation of said second semi-conductor control means for simultaneously providing a steep wave front reference signal at each said output terminal.

5. The invention defined in claim 4, wherein said first mentioned means further comprises electromagnetic means responsive to operation of said first semi-conductor control means for controlling said second semi-conductor control means simultaneously and abruptly to terminate said reference signal at each said output terminal.

6. The invention defined in claim 1, wherein said delayed output signal providing means comprises a plurality of semi-conductor control means respectively corresponding to said plurality of output terminals, means responsive to said input signal for concurrently rendering said plurality of semi-conductor control means operative, and a plurality of magnetic means respectively corresponding to said plurality of semi-conductor control means, said plurality of magnetic means having different delay characteristics, and said plurality of magnetic means being responsive to operation of their associated semi-conductor control means for providing at the associated output terminals steep wave front output signals which are delayed for different predetermined time intervals relative to their associated reference signals.

7. The invention defined in claim 6, wherein each said magnetic means comprises a first electromagnetic element for controlling initiation of the associated delayed steep wave front output signal a predetermined time interval after the reference signal, and a second electromagnetic element for controlling abrupt termination of such associated delayed output signal a predetermined time interval after initiation thereof.

8. The invention defined in claim 7, wherein each said first electromagnetic element comprises a square-hysteresis-loop magnetic core inductor for delaying the initiation of the associated delayed steep wave front output signal, and each said second electromagnetic element comprises a square-hysteresis-loop magnetic core inductor for delaying the abrupt termination of said associated delayed output signal.

9. The invention defined in claim 8, together with a trimming resistor connected across at least one of said second inductors to adjust the duration of the associated delayed output signal.

10. In an electrical system for providing a plurality of coded output pulse signals in response to each input pulse signal received from an input pulse signal source, a plurality of output terminals, a plurality of semi-conductor control circuits respectively corresponding to said output terminals, means responsive to an input pulse signal for simultaneously rendering said semi-conductor control circuits operative, an additional semi-conductor control circuit common to said output terminals, control means associated with one of said plurality of semi-conductor control circuits and responsive to operation of the latter for rendering said additional semi-conductor control circuit operative simultaneously to apply an identical reference pulse to each said output terminal, and a plurality of electromagnetic delay circuits having different delay characteristics respectively corresponding to said plurality of output terminals and to said plurality of semi-conductor control circuits and being responsive to operation of the latter for applying progressively delayed output pulses to the respective output terminals, and the reference pulse and its associated delayed pulse at each output terminal forming a distinct pulse signal code.

11. The invention defined in claim 10, together with a semi-conductor diode common to said semi-conductor control circuits and being responsive to each input pulse signal for maintaining the amplitude of the reference and delayed output pulses constant.

12. The invention defined in claim 10, wherein said control means comprises voltage control means responsive to operation of said one semi-conductor control circuit for rendering said additional semi-conductor control circuit operative thereby to initiate a steep wave front reference pulse at each output terminal, and a square-hysteresis-loop magnetic core inductor also responsive to operation of said one semi-conductor control circuit to effectively shunt said voltage control means a predetermined time interval after initiation of said reference pulses thereby to render said additional semi-conductor control circuit ineffective and to simultaneously and abruptly terminate said reference pulses.

13. The invention defined in claim 10, wherein each said electromagnetic delay circuit comprises a series square-hysteresis-loop magnetic core inductor connected in series circuit between each of said plurality of semi-conductor control circuits and the respectively associated output terminal, said inductor being operative to saturate a predetermined time interval afer initiaion of the associated reference pulse to apply a steep wave front delayed pulse to said associated output terminal, and a shunt square-hysteresis-loop magnetic core inductor connected in parallel with each output terminal and being operative to saturate a predetermined time interval after initiation of the associated delayed pulse to abruptly terminate the latter.

14. The invention defined in claim 13, together with undirectional conducting means for isolating said output terminals from one another.

15. In an electrical system for providing a plurality of coded output square-wave voltage pulse signals in response to each input square-wave voltage pulse of a series of input pulses received from an input pulse source, a plurality of output terminals connectable to a corresponding plurality of load devices, a plurality of pulse control circuits respectively corresponding to the load devices and connected in parallel between the input pulse source and said output terminals, a reference pulse circuit connected between one of said pulse control circuits and said output terminals, each of said pulse control circuits comprising a switching circuit and a delay network, said switching circuit comprising a switching transistor, means normally biasing said switching transistor to maintain the same non-conducting, and means responsive to an input voltage pulse for rendering said switching transistor conducting, said reference pulse circuit comprising a reference pulse control transistor, means normally biasing said reference pulse control transistor to maintain the same non-conducting, control means responsive to conduction of said switching transistor for rendering said reference pulse control transistor conducting to apply an identical steep wave front reference voltage pulse to each output terminal, and inductive means also responsive to conduction of said switching transistor for shunting said control means to render said reference pulse control transistor non-conducting thereby abruptly to terminate said reference pulses, and each said delay network comprising inductive means responsive to conduction of the associated switching transistor for applying a delayed square-wave voltage pulse to the associated output terminal, the inductive means in the respective delay networks having different time delay characteristics whereby the time space between each reference pulse and its associated delayed pulse is different for the respective output terminals.

16. The invention defined in claim 15, together with a semi-conductor diode common to the switching transistors in said pulse control circuits for maintaining the amplitude of said reference pulses and said delayed pulses constant.

17. The invention defined in claim 15, wherein said inductive means in said reference pulse circuit comprises a square-hysteresis-loop magnetic core inductor operable upon saturation to shunt said control means thereby to render said reference pulse control transistor non-conducting.

18. The invention defined in claim 15, wherein each said inductive means in said delay networks comprises a first square-hysteresis-loop magnetic core inductor connected in series between the associated switching transistor and output terminal and operable upon saturation for initiating a delayed output voltage pulse, and a second square-hysteresis-loop magnetic core inductor connected in parallel with the associated load device and operable upon saturation for terminating such delayed output voltage pulse.

References Cited in the file of this patent

UNITED STATES PATENTS

| | | |
|---|---|---|
| 2,759,142 | Hamilton | Aug. 14, 1956 |
| 2,896,093 | Castruccio | July 21, 1959 |